United States Patent
Lemke et al.

(10) Patent No.: US 9,318,550 B2
(45) Date of Patent: Apr. 19, 2016

(54) SEMICONDUCTOR DEVICE WITH DEVICE SEPARATION STRUCTURES

(71) Applicant: Infineon Technologies Dresden GmbH, Dresden (DE)

(72) Inventors: Marko Lemke, Dresden (DE); Rolf Weis, Dresden (DE); Stefan Tegen, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 0 days.

(21) Appl. No.: 14/625,796

(22) Filed: Feb. 19, 2015

(65) Prior Publication Data
US 2015/0179736 A1    Jun. 25, 2015

Related U.S. Application Data

(62) Division of application No. 13/935,038, filed on Jul. 3, 2013, now Pat. No. 8,987,090.

(51) Int. Cl.

| | | |
|---|---|---|
| *H01L 21/76* | (2006.01) | |
| *H01L 29/94* | (2006.01) | |
| *H01L 31/062* | (2012.01) | |
| *H01L 31/113* | (2006.01) | |
| *H01L 31/119* | (2006.01) | |
| *H01L 29/06* | (2006.01) | |
| *H01L 21/762* | (2006.01) | |
| *H01L 29/78* | (2006.01) | |
| *H01L 29/423* | (2006.01) | |

(Continued)

(52) U.S. Cl.
CPC ...... *H01L 29/0649* (2013.01); *H01L 21/76224* (2013.01); *H01L 21/823431* (2013.01); *H01L 21/823481* (2013.01); *H01L 27/0883* (2013.01); *H01L 27/0886* (2013.01); *H01L 29/4236* (2013.01); *H01L 29/7813* (2013.01); *H01L 29/7827* (2013.01); *H01L 27/0207* (2013.01); *H01L 27/088* (2013.01)

(58) Field of Classification Search
CPC ....... H01L 29/76; H01L 29/94; H01L 31/062; H01L 31/113; H01L 31/119; H01L 29/7813; H01L 29/0195; H01L 29/66734; H01L 29/0696
USPC .......................................... 257/330; 438/270
See application file for complete search history.

(56) References Cited

U.S. PATENT DOCUMENTS

| | | | |
|---|---|---|---|
| 6,221,723 B1 * | 4/2001 | Kunitou | 438/276 |
| 7,274,077 B2 | 9/2007 | Henninger et al. | |

(Continued)

*Primary Examiner* — Phuc Dang
(74) *Attorney, Agent, or Firm* — Murphy, Bilak & Homiller, PLLC

(57) ABSTRACT

A semiconductor device includes a first gate electrode structure, a second gate electrode structure, a device separation structure, and cell separation structures. The first gate electrode structure is buried in a semiconductor portion in a first cell array at a distance to a first surface of the semiconductor portion. The first gate electrode structure includes parallel array stripes. The second gate electrode structure is buried in the semiconductor portion in a second cell array adjacent to the first cell array. The second gate electrode structure includes parallel array stripes. The device separation structure is between the first and second cell arrays. The device separation structure has a first width. The cell separation structures have at most a second width smaller than the first width and notching, at the first surface, semiconductor fins formed from sections of the semiconductor portion between the array trenches.

9 Claims, 11 Drawing Sheets

(51) Int. Cl.
  *H01L 21/8234* (2006.01)
  *H01L 27/088* (2006.01)
  *H01L 27/02* (2006.01)

(56) References Cited

U.S. PATENT DOCUMENTS

| | | | |
|---|---|---|---|
| 7,723,191 B2 | 5/2010 | Kang et al. | |
| 8,455,948 B2 | 6/2013 | Weis | |
| 8,502,274 B1 | 8/2013 | Matoy et al. | |
| 2008/0113515 A1 | 5/2008 | Kim et al. | |
| 2008/0197442 A1* | 8/2008 | Hirler et al. | 257/496 |
| 2010/0216290 A1 | 8/2010 | Lin et al. | |
| 2012/0175634 A1 | 7/2012 | Weis | |
| 2012/0175635 A1 | 7/2012 | Weis et al. | |
| 2014/0151789 A1* | 6/2014 | Cotorogea et al. | 257/334 |
| 2014/0167154 A1 | 6/2014 | Nelle et al. | |

* cited by examiner

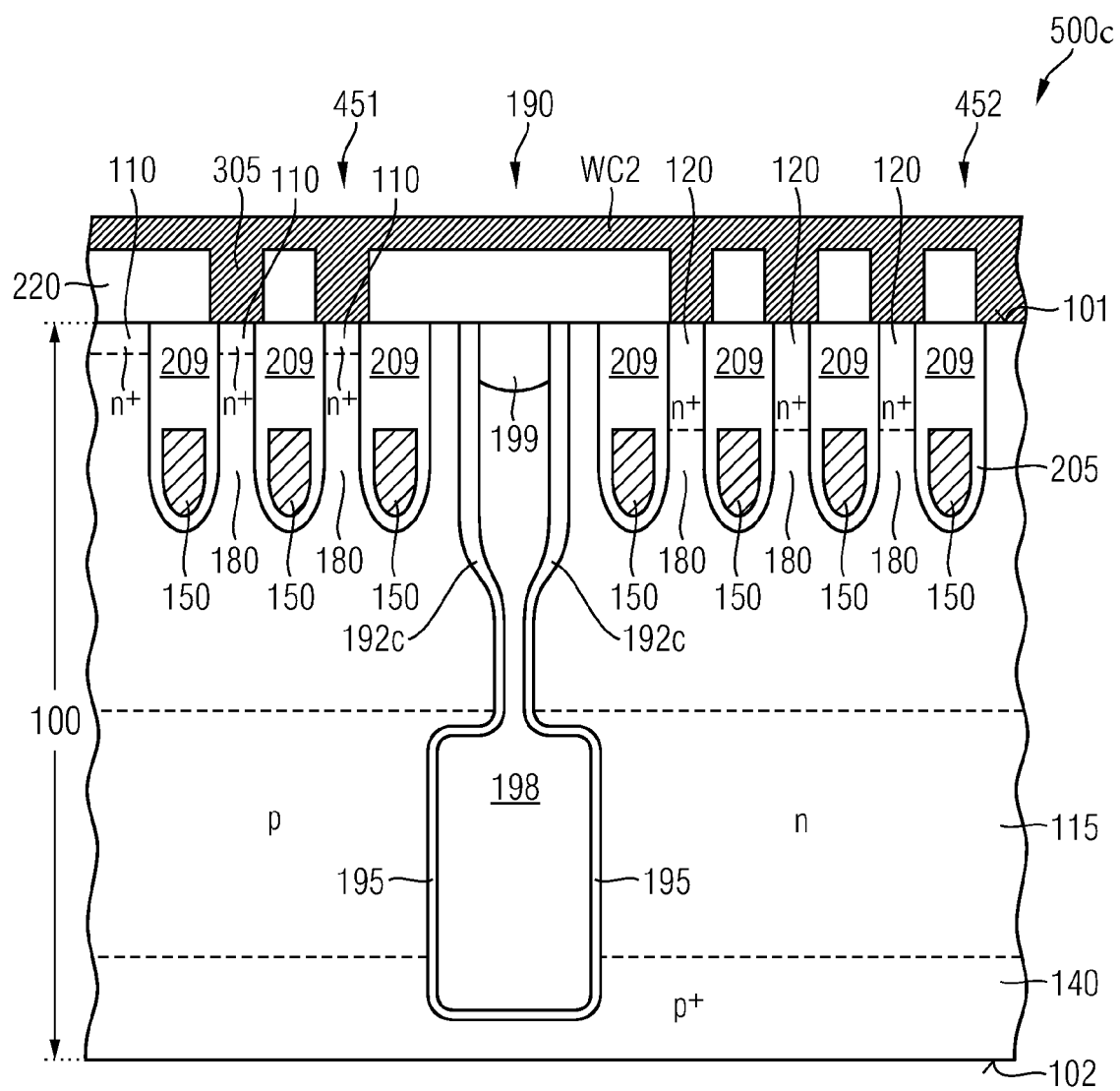

SEMICONDUCTOR DEVICE WITH DEVICE SEPARATION STRUCTURES

CROSS-REFERENCE TO RELATED APPLICATIONS

This application is a Divisional of U.S. patent application Ser. No. 13/935,038 filed on Jul. 3, 2013, now U.S. Pat. No. 8,987,090.

BACKGROUND

Power semiconductor devices like MOSFETs (metal oxide semiconductor field effect transistors) sustain a high breakdown voltage in a blocking mode and have a low on-state resistance in a conductive mode. Power semiconductor devices therefore usually include a drift region between a voltage-controlled body region and a drain region. Increasing the length of the drift zone increases the voltage blocking capability but at the same time increases the on-state resistance. A power semiconductor device may integrate two or more functional blocks implementing transistor functionalities and being arranged in series, in parallel or in other configurations in the same semiconductor die to implement specific functions and/or to obtain specific device characteristics. Structures between the functional blocks sustain potential differences between the functional blocks. It is desirable to provide reliable semiconductor devices and methods that provide a simple and cost effective manufacturing process.

SUMMARY

In accordance with an embodiment, a method of manufacturing a semiconductor device includes introducing at least a first and a second trench pattern including array trenches from a first surface into a semiconductor substrate, wherein an array isolation portion of the semiconductor substrate separates the first and second trench patterns. A buried gate electrode structure is provided in the first and second trench patterns at a distance to the first surface. In a single etch process, both a device separation trench having a first width is introduced into the array isolation portion and cell separation trenches having at most a second width that is smaller than the first width are introduced into semiconductor fins between the array trenches.

Another embodiment refers to a semiconductor device. A first gate electrode structure including parallel array stripes is buried in a semiconductor portion in a first cell array, at a distance to a first surface of the semiconductor portion. A second gate electrode structure including parallel array stripes is buried in the semiconductor portion in a second cell array adjacent to the first cell array. A device separation structure between the first and second cell arrays has a first width. Cell separation structures that notch, at the first surface, semiconductor fins formed from sections of the semiconductor portion between the array trenches have at most a second width smaller than the first width.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

FIG. 3 is a schematic cross-sectional view of a portion of a semiconductor device in accordance with an embodiment including a bottle-shaped device separation structure.

DETAILED DESCRIPTION

Figure 1A:
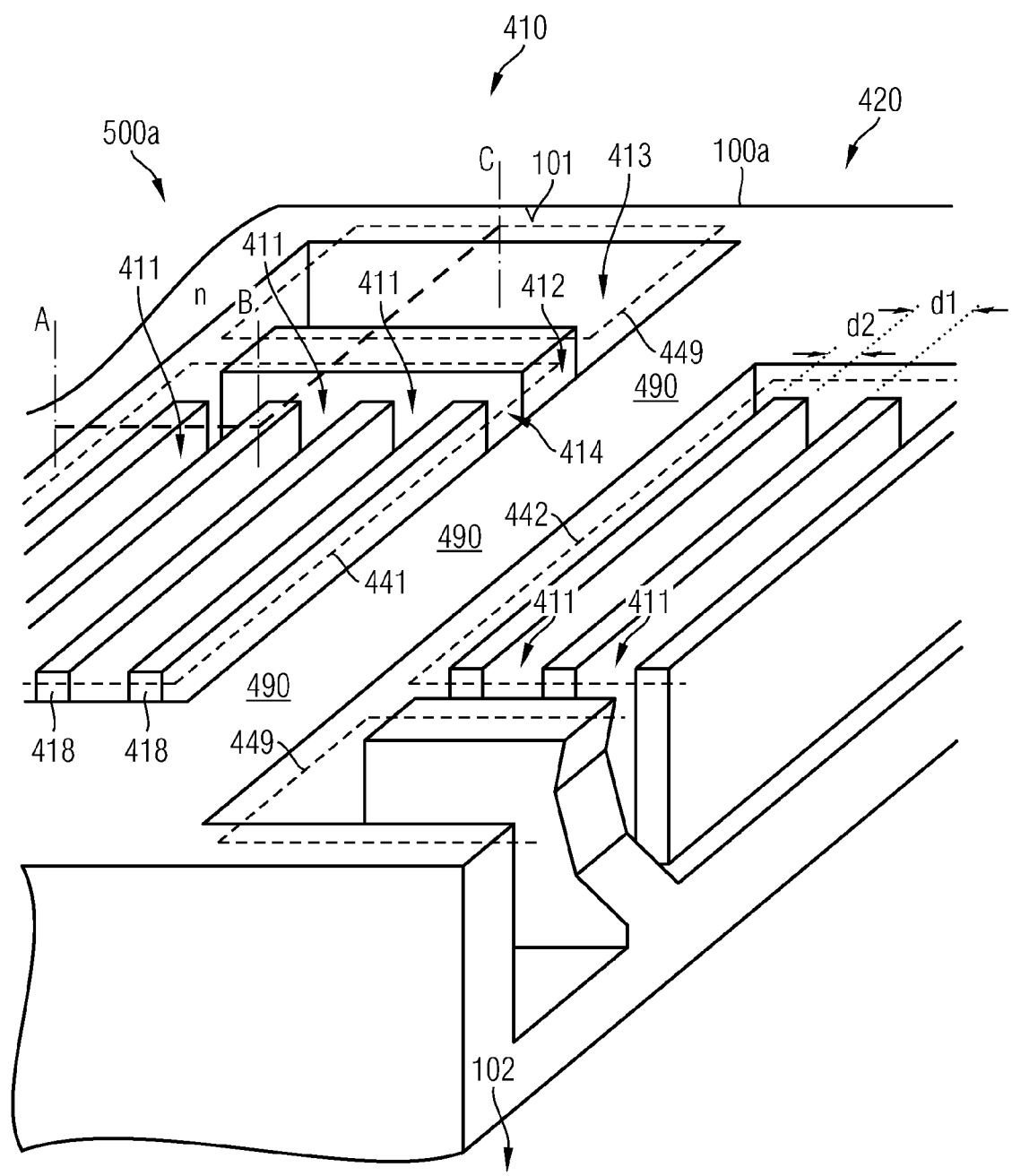
FIG. 1A is a schematic perspective view of a portion of a semiconductor substrate, for illustrating a method of manufacturing a semiconductor device in accordance with an embodiment, after introducing trench patterns into the semiconductor substrate.

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same or similar elements have been designated by corresponding references in the different drawings if not stated otherwise.

The terms "having", "containing", "including", "comprising" and the like are open and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The method illustrated in FIGS. 1A to 1E provides a semiconductor substrate 500a consisting of or containing a semiconductor layer 100a of a single-crystalline semiconductor material. The single-crystalline semiconductor material may be silicon Si, silicon carbide SiC, germanium Ge, a silicon germanium crystal SiGe, gallium nitride GaN or gallium arsenide GaAs, by way of example. For example, the semiconductor substrate 500a may be a silicon wafer. A plurality of identical semiconductor dies may be obtained from the semiconductor substrate 500a. The semiconductor substrate 500a may include further semiconductor and dielectric layers in addition to the semiconductor layer 100a.

The semiconductor layer 100a has a planar first surface 101 and a planar second surface 102 parallel to the first surface 101. The normal to the first and second surfaces 101, 102 defines a vertical direction and directions orthogonal to the vertical direction are lateral directions.

At least a first and a second trench pattern 410, 420 are introduced into the semiconductor layer 100a from the first surface 101. Further trench patterns may be formed in other portions of the semiconductor substrate 500a, e.g., contemporaneously with the first and second trench patterns 410, 420. An array isolation portion 490 of the semiconductor layer 100a spatially separates the first and second trench patterns 410, 420 from each other. A further array isolation portion 490 may spatially separate the first and/or second trench patterns 410, 420 from one or more further trench patterns and/or some or all of the further trench patterns from each other. Each of the trench patterns 410, 420 and further trench patterns may be completely surrounded by an array isolation portion 490 in the lateral directions, wherein each array isolation portion 490 surrounds one single of the trench patterns.

The first and second trench patterns 410, 420 include array trenches 411, wherein portions of the semiconductor layer 100a between neighboring pairs of array trenches 411 form semiconductor fins 418. Each of the trench patterns 410, 420 may further include one or more contact trenches 413 structurally connected with the array trenches 411 of the respective trench pattern 410, one or more auxiliary trenches 414 connecting the array trenches 411 and one or more spacer trenches 412 connecting the contact trenches 413 with the auxiliary or array trenches 414, 411 of the concerned trench pattern 410, 420.

For example, a mask layer may be deposited on the first surface 101 and patterned by a photolithographic technique to generate an etch mask with mask openings exposing portions of the first surface 101 corresponding to the trenches of the first and second trench patterns 410, 420. A predominantly anisotropic etch removes semiconductor material of the semiconductor layer 100a in the vertical projection of the mask openings.

FIG. 1A shows the first and second trench patterns 410, 420 and the array isolation portion 490 separating the first and second trench patterns 410, 420 from each other. The array trenches 411 may be regularly spaced parallel stripes. The array trenches 411 may have equal widths and may be equally spaced at a center-to-center distance (pitch) between 20 nm and 500 nm, for example between 150 nm and 250 nm. For example, the width d1 may be at least twice the width d2. Each of the trench patterns 410, 420 may define one or more semiconductor fins 418, for example one thousand or more semiconductor fins 418.

The array trenches 411 of the first trench pattern 410 are assigned to a first switching device and are formed within a first cell area 441. The array trenches 411 of the second trench pattern 420 are assigned to a second switching device and are formed within a second cell area 442. Array trenches of further trench patterns may be assigned to further switching devices. One, two, or more auxiliary trenches 414 extending in a direction intersecting the array trenches 411 may connect the array trenches 411 of the same trench pattern 410, 420 with each other.

The contact trenches 413 are formed in contact areas 449 outside the cell areas 441, 442. The contact trenches 413 may run perpendicular or parallel to the array trenches 411 and may or may not directly adjoin the respective cell area 441, 442. According to the illustrated embodiment, the contact trench 413 of the first trench pattern 410 is spaced from the first cell area 441 and one, two, or more spacer trenches 412 structurally connect the contact trench 413 with the array trenches 411 and/or with one or more of the auxiliary trenches 414 of the first trench pattern 410. A width of the contact trench 413 may be equal to or greater than the width d1 of the widest array trench 411.

The first and second trench patterns 410, 420 are arranged along a first lateral direction which may be orthogonal to a second lateral direction defined by the longitudinal axes of the array trenches 411. The second trench pattern 420 may be arranged in the projection of the first trench pattern 410 along the first lateral direction. For example, the cell areas 441, 442 may be arranged along the same lateral axis. Further trench patterns, which are structurally disconnected from the first and second trench patterns 410, 420, may be formed along the same lateral axis.

A gate dielectric layer 205 may be formed on the exposed semiconductor material of the semiconductor layer 100a. The formation of the gate dielectric layer 205 may include a thermal oxidation of the semiconductor material of the semiconductor layer 100a or the deposition of a dielectric material, for example silicon oxide, or both. According to an embodiment, providing the gate dielectric layer 205 includes a thermal oxidation of the semiconductor material of the semiconductor layer 100a, deposition of a silicon oxide using, e.g., TEOS (tetra ethyl ortho silicate) as precursor material, as well as a further thermal treatment. Forming the gate dielectric layer 205 may include the formation of a silicon nitride or silicon oxynitride layer and/or the deposition of other dielectric materials.

A conductive gate material is deposited on the gate dielectric layer 205 and fills the first and second trench patterns 410, 420. The conductive gate material may be heavily doped polycrystalline silicon. According to other embodiments more than one gate material is deposited to form a layered structure that may include one or more metal-containing layers. The gate material(s) is/are recessed to form, in each trench pattern 410, 420, a contiguous gate electrode structure 150 completely buried between the first and second surfaces 101, 102 at a distance to the first surface 101, whereby the gate electrode structures 150 in the cell areas 441, 442 are separated by a recess and/or polishing process taking place at the first surface 101.

A fill material is deposited, for example a semiconductor oxide. According to an embodiment, the fill material is silicon oxide, for example obtained using TEOS as precursor material. The fill material may be one single material or may include two or more sub-layers of different materials. According to an embodiment, the fill material is a homogenous dielectric layer, e.g., from a silicon oxide.

An anisotropic etch may remove horizontal excess portions of both the fill material 209a and the gate dielectric layer 205 outside the trench patterns 410, 420 and a thin sacrificial oxide layer may be formed on the exposed surfaces of the semiconductor fins 418. According to other embodiments, the horizontal excess portions of the fill material 209a outside the trench patterns may be maintained for the following processing.

Figure 1B:
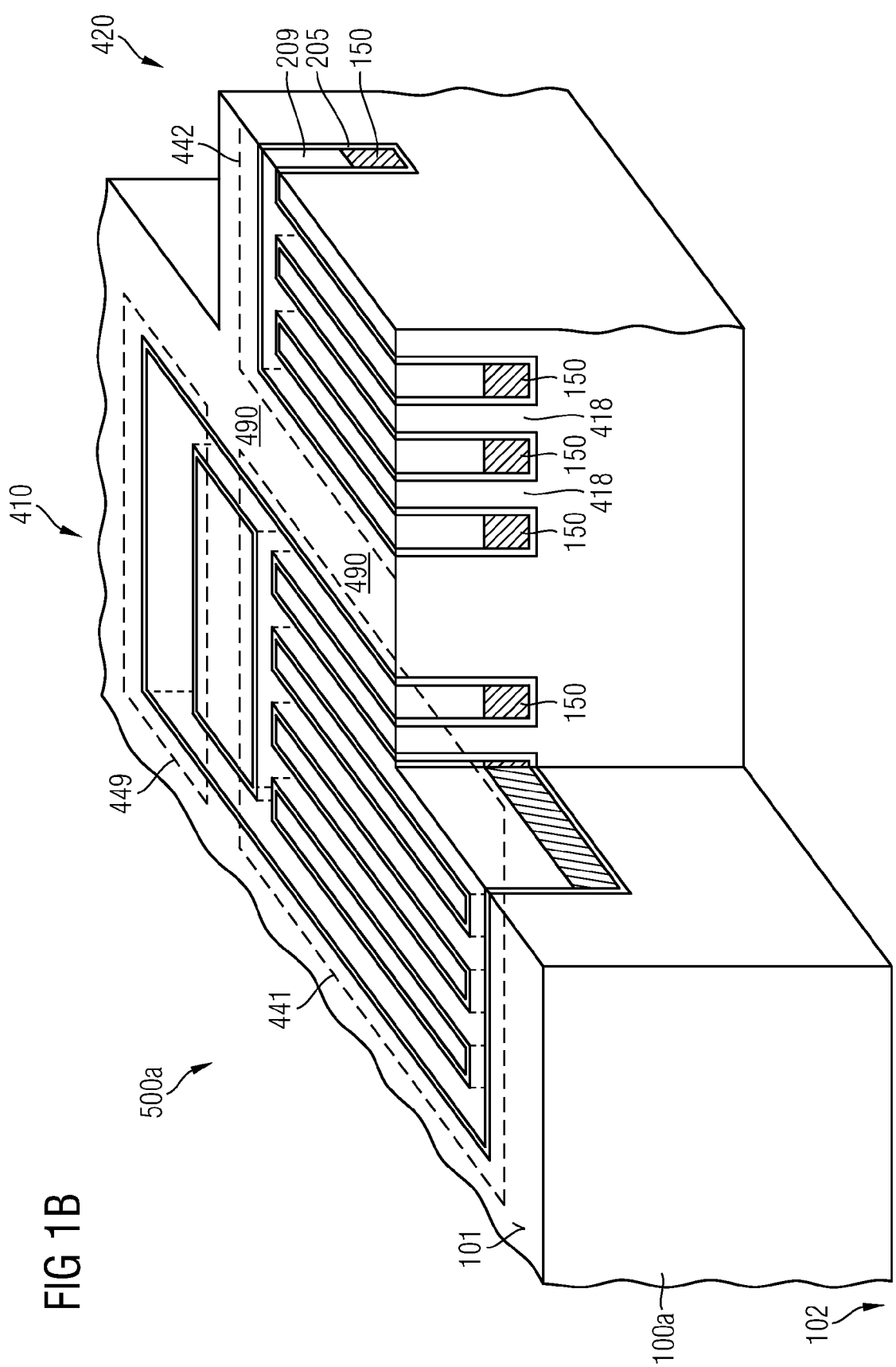
FIG. 1B is a schematic perspective view of the semiconductor substrate portion of FIG. 1A, after providing buried gate electrode structures and fill structures in the trench patterns.

FIG. 1B shows the conformal gate dielectric layer 205 lining the trench patterns 410, 420 and the recessed gate material forming a contiguous gate electrode structure 150 in lower sections of the trench patterns 410, 420. The gate electrode structures 150 may be spaced from the first surface 101 by more than 0 nm, for example by at least 500 nm and at most 1.5 µm. The fill material forms fill structures 209 between the gate electrode structures 150 and the first surface 101.

Figure 1C:
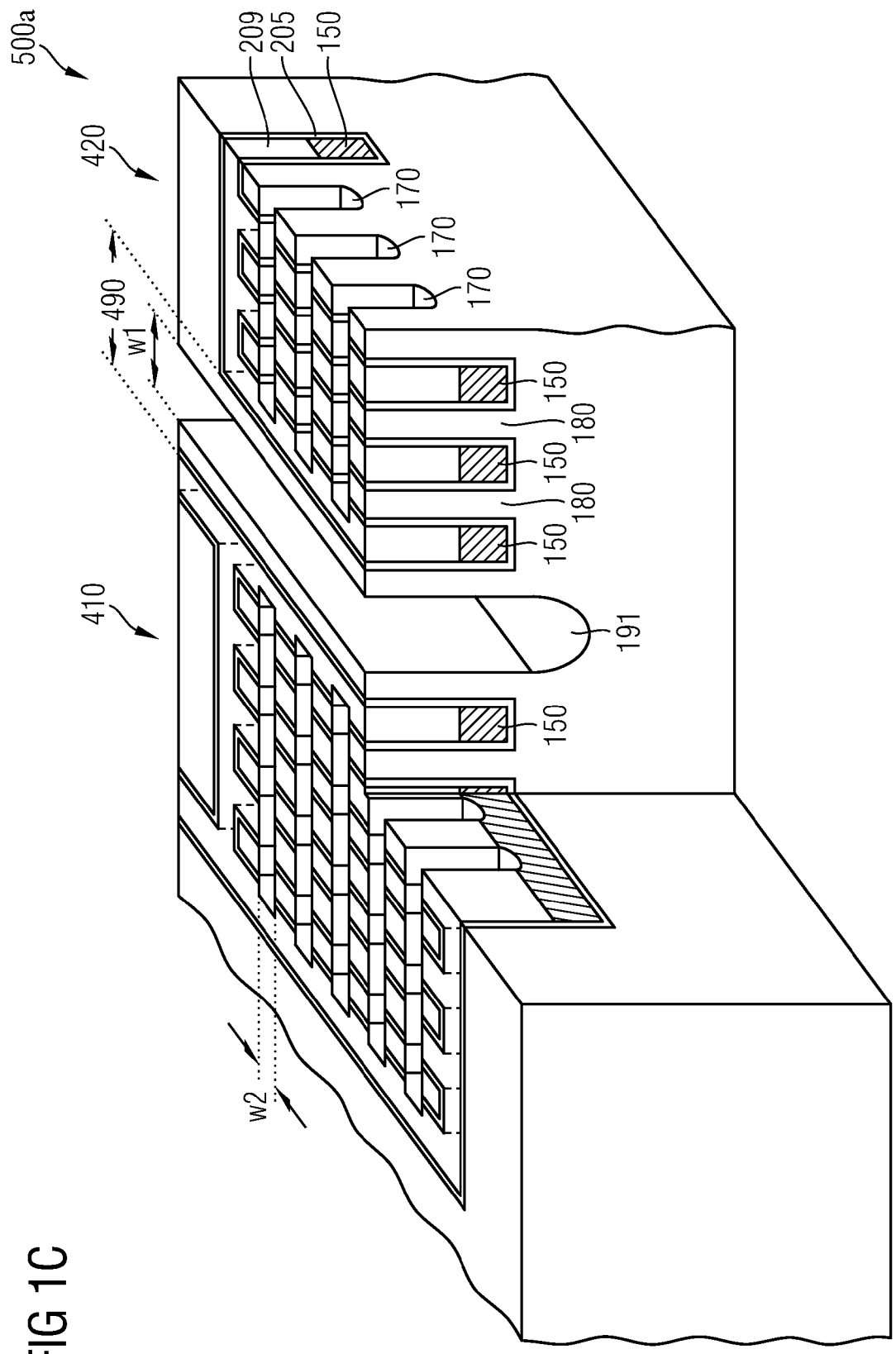
FIG. 1C is a schematic perspective view of the semiconductor substrate portion of FIG. 1B, after introducing a device separation trench and cell separation trenches.

Referring to FIG. 1C, in a single, shared etch process a device separation trench 191 having a first width w1 is introduced into the array isolation portion 490 and cell separation trenches 170 having at most a second width w2, which is smaller than the first width w1, are introduced to notch at least the semiconductor fins 418 along the first surface 101.

For example, a lithography process provides a separation etch mask with first openings extending along the first lateral direction and crossing the semiconductor fins 418 within the cell areas 441, 442 and second openings extending along the second lateral direction between cell areas 441, 442 assigned to different switching devices.

A predominantly anisotropic etch process removes material in the vertical projection of the first and second openings in the separation etch mask to form cell separation trenches 170 in the vertical projection of the first openings and device separation trenches 191 in the vertical projection of the second openings. The anisotropic etch may or may not be material-selective. For example, the etch process may have a high etch selectivity between the material of the semiconductor fins 418 and the fill material of the fill structures 209, such that only the semiconductor fins 418 are recessed while the fill structures 209 remain substantially unaffected. The resulting cell separation trenches 170 are hole trenches arranged in a matrix within the respective cell area 441, 442. According to another embodiment, the etch process has no etch selectivity, such that cell separation trenches 170 are stripes extending along the first direction and notching both the semiconductor fins 418 and the fill structures 209.

FIG. 1C shows stripe-shaped cell separation trenches 170 extending along the first lateral direction orthogonal to the orientation of notched semiconductor fins 180. The cell separation trenches 170 are shallower than the array trenches 411 and may extend deeper into the semiconductor layer 100a than the fill structures 209. The device separation trenches 191 run along the second lateral direction between the cell areas 441, 442. The device separation trenches 191 may be deeper than the cell separation trenches 170. For example, the device separation trenches 191 may be deeper than the trench patterns 410, 420.

An insulator layer 192 may be deposited in a predominantly conformal manner, wherein the thickness of the insulator layer 192 is at least half of the width w2 of the cell separation trenches 170 and at most a half of the width w1 of the device separation trench 191. The insulator layer 192 may be a homogenous layer or may include two or more sub-layers. The insulator layer 192 is selectively etchable against the semiconductor material of the semiconductor portion 100 and may be a non-conductive material, e.g., intrinsic polycrystalline silicon, or a dielectric material. The insulator layer 192 may be removed from the device separation trench 191 later in the process, or at least a portion of the insulator layer 192 may form a remnant layer in a device separation structure of the finalized device.

According to an embodiment, the insulator layer 192 includes a silicon oxide layer, a silicon nitride layer, and/or a silicon oxynitride layer. The process for depositing the insulator layer 192 may be controlled such that less material is deposited at the bottom of the device separation trench 191 than over the first surface 101.

Figure 1D:
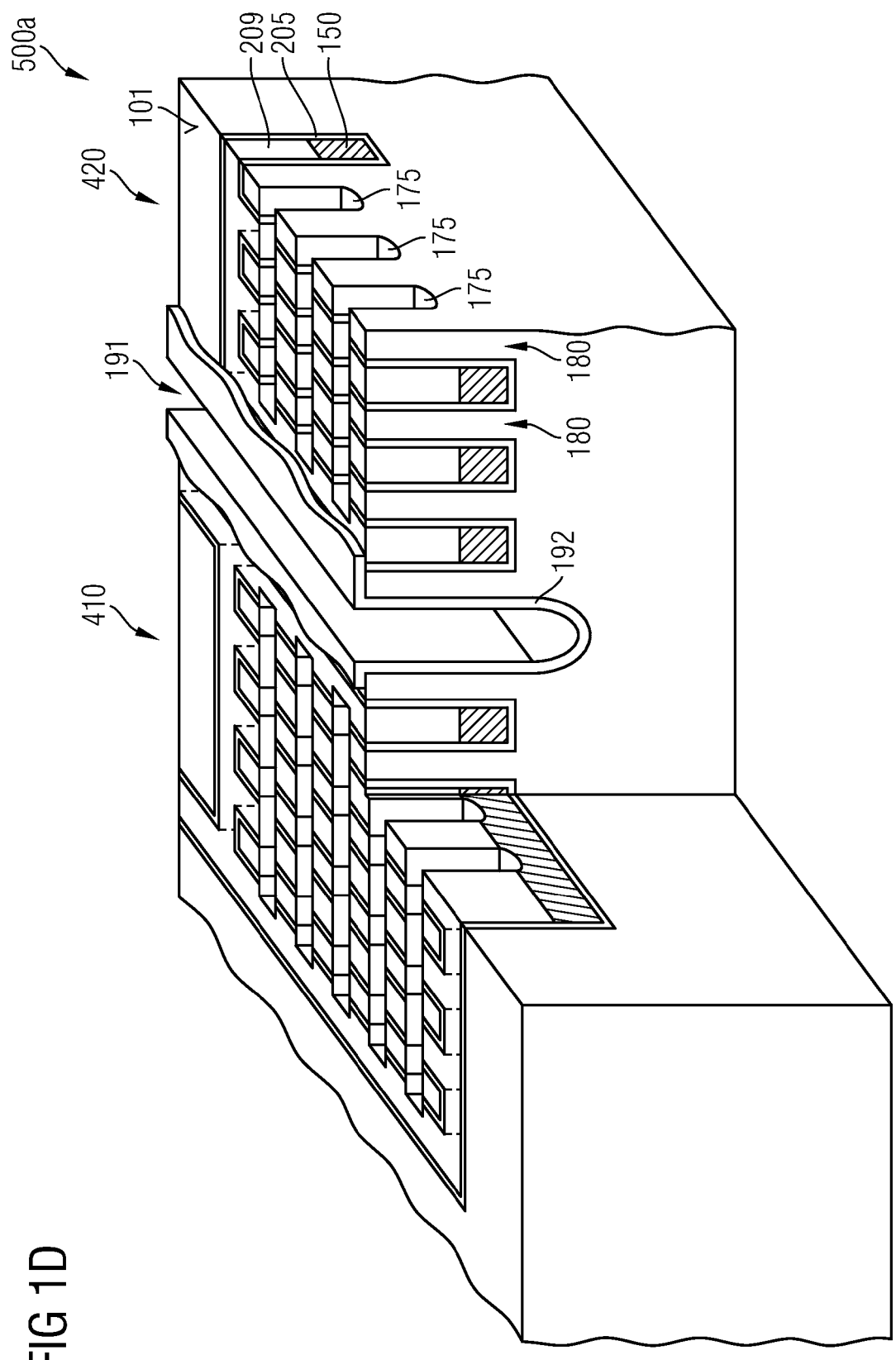
FIG. 1D is a schematic perspective view of the semiconductor substrate portion of FIG. 1C, after providing an insulator layer filling the cell separation trenches.

FIG. 1D shows the insulator layer 192 lining the device separation trench 191, forming cell separation structures 175 in upper sections of at least the notched semiconductor fins 180 and covering the first surface 101. The cell separation structures 175 may form stripes through the notches of the notched fill structure 209 and the notched semiconductor fins 180. According to other embodiments, the cell separation trenches 175 notch exclusively the notched semiconductor fins 180 and form, for each cell area 441, 442, a matrix of dielectric plugs. Portions of the insulator layer 192 outside the device separation trenches 191 may be thicker than portions of the insulator layer 192 covering bottom portion of the device separation trenches 191.

An etch process may be performed that may thin the thick portions of the insulator layer 192 over the first surface 101 and that completely removes thin portions of the insulator layer 192 at the bottom of the device separation trenches 191.

Using the resulting patterned insulator layer 192c as an etch mask, the device separation trenches 191 may be deepened by forming extension portions 191z etched into the semiconductor layer 100a. The extension etch may have an anisotropic component such that the extension portions 191z may have a wider lateral cross-sectional area than the openings of the patterned insulator layer 192c. A passivation layer 195 may be provided to cover the semiconductor material exposed by the extension etch, for example by a thermal oxidation of the exposed semiconductor material. The device separation trenches 191 may be completely or partially filled with a dielectric material or an intrinsic semiconductor material, by way of example. According to another embodiment, a device separation void is provided in the device separation trenches 191 by forming dielectric plugs closing the openings of the device separation trenches 191.

Figure 1E:
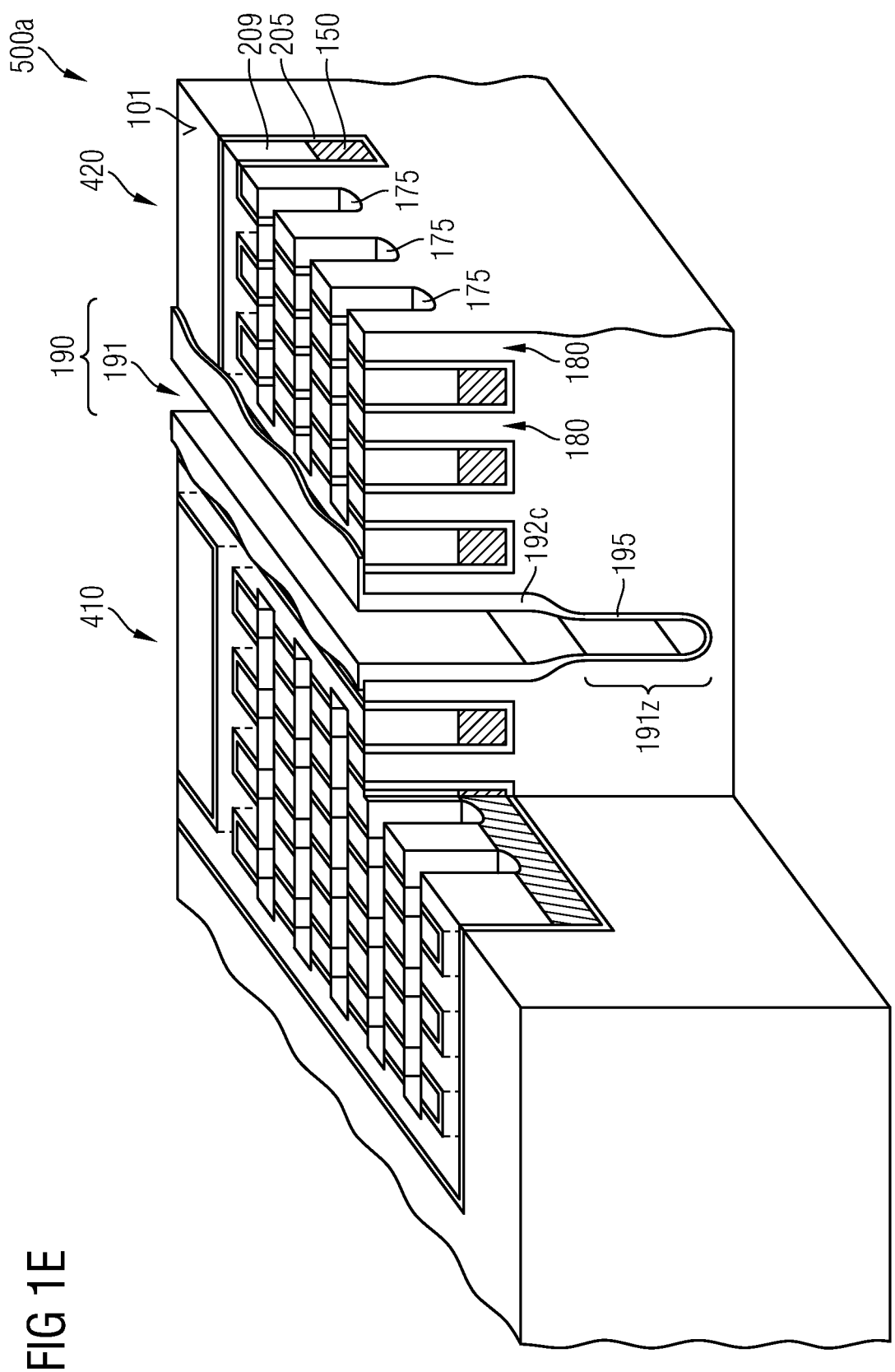
FIG. 1E is a schematic perspective view of the semiconductor substrate portion of FIG. 1D, after providing extension portions of the device separation trench.

FIG. 1E shows the thinned, patterned insulator layer 192c still covering the first surface 101 and openings in the insulator layer 192c at the bottoms of first sections of the device separation trenches 191. A device separation structure 190 includes a first section lined by the patterned insulator layer 192c and the extension portion 191z lined by the passivation layer 195. The extension portion 191z may or may not reach a substrate layer and may have a wider lateral cross-sectional area than the openings of the patterned insulator layer 192c. The device separation structure 190 may include a device separation void closed by a dielectric plug. According to other embodiments, the device separation structure 190 includes a fill portion of a dielectric material or an intrinsic semiconductor material. The fill portion may partially or completely fill the space within the patterned insulator layer 192c and the passivation layer 195.

Where conventional approaches rely on three critical photo masks for defining semiconductor fins, cell separation structures and device isolation structures, the present embodiments get by with only two photo masks. In addition, for separating the gate electrode structures 150 assigned to different cell areas 441, 442, conventional approaches use an etch mask exposing the gate material in a trench and a device separation etch removes material along vertical sidewalls of the semiconductor layer 100a, with the risk that remnants of the gate material at the sidewalls of the device separation trench structurally connect and short-circuit the concerned gate electrode structures 150 of neighboring cell areas 441, 442. In contrast, the above described process inherently separates the gate electrode structures 150, which are assigned to different cell areas 441, 442, over the array isolation portion 490 and outside of trenches. Hence, the method provides more reliably separated gate electrode structures with less effort.

Figure 2A:
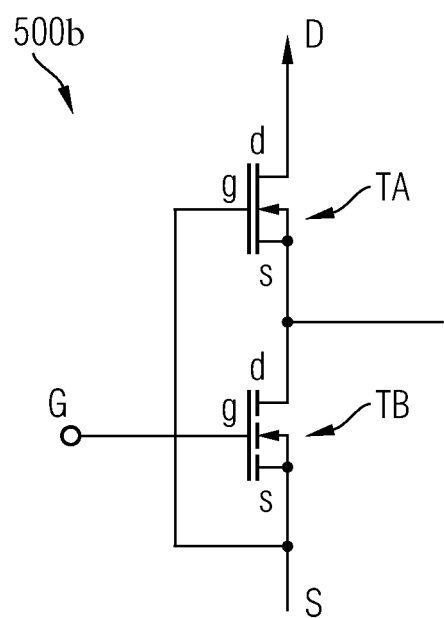
FIG. 2A is a schematic circuit diagram of a semiconductor device in accordance with an embodiment integrating an enhancement type IFGET (insulated gate field effect transistor) and a depletion type IGFET.

The embodiments include combinations of two or more transistor devices of the same type or of different types including, for example, p channel FETs of the enhancement and depletion type and n channel FETs of the enhancement and depletion type. As illustrated in FIG. 2A, a power semiconductor device 500b according to an embodiment may include at least two semiconductor switching devices, e.g., an enhancement type IGFET TB and a depletion type IGFET TA that may be arranged in a cascode connection. The load paths between the sources s and drains d of the IGFETs TA, TB are arranged in series between drain and source terminals D, S of the power semiconductor device 500b, providing an IGFET functionality. The gate terminal G of the semiconductor device 500b or the output of an integrated gate driver is electrically connected or coupled to the gate electrode g of the enhancement type IGFET TB. The source s of the enhancement type IGFET TB may be electrically connected or coupled to the gate electrode g of the depletion type IGFET TA. The drain d of the enhancement type IGFET TB is electrically connected with the source s of the enhancement type IGFET TA. The IGFETs TA, TB may be n-channel IGFETs as further described in the following. Equivalent considerations apply to p-channel IGFETs.

In a blocking mode, each of the IGFETs TA, TB sustains a portion of the total blocking voltage. In the conductive mode, the two IGFETs TA, TB, whose load paths are electrically arranged in series, may provide an on-state resistance which is lower or at least in the range of the on-state resistance of a single IGFET device having a comparable blocking voltage capability. Since the total blocking voltage can be modified by the numbers of transistors electrically arranged in series and integrated in the same semiconductor die in a lateral direction, device parameters like blocking voltage capability and on-state resistance for IGFET designs can be modified without modifying the thickness of a semiconductor substrate 100 through expensive grinding and polishing processes.

Figure 2B:
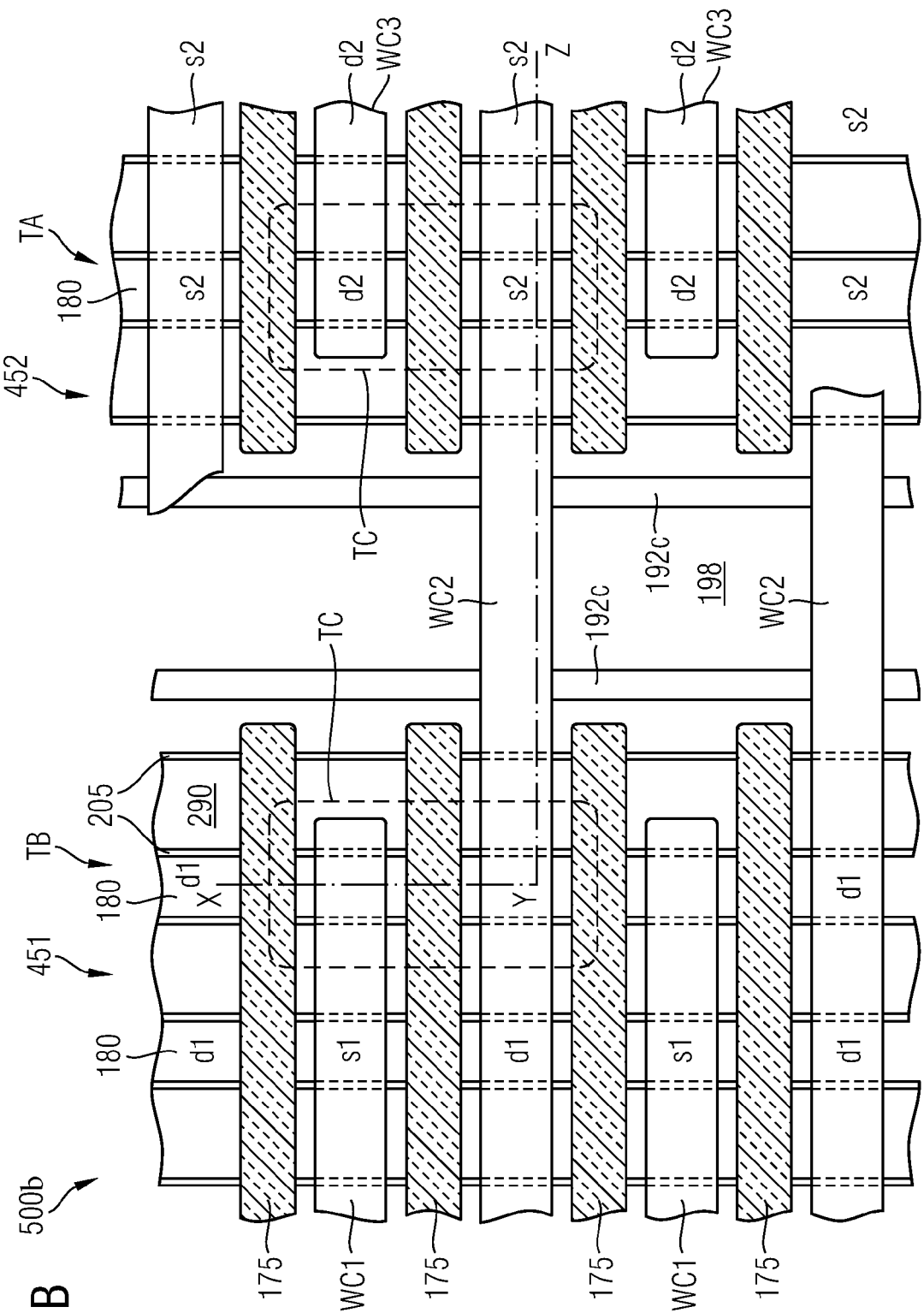
FIG. 2B is a schematic plan view of a portion of the semiconductor device of FIG. 2A.
Figure 2C:
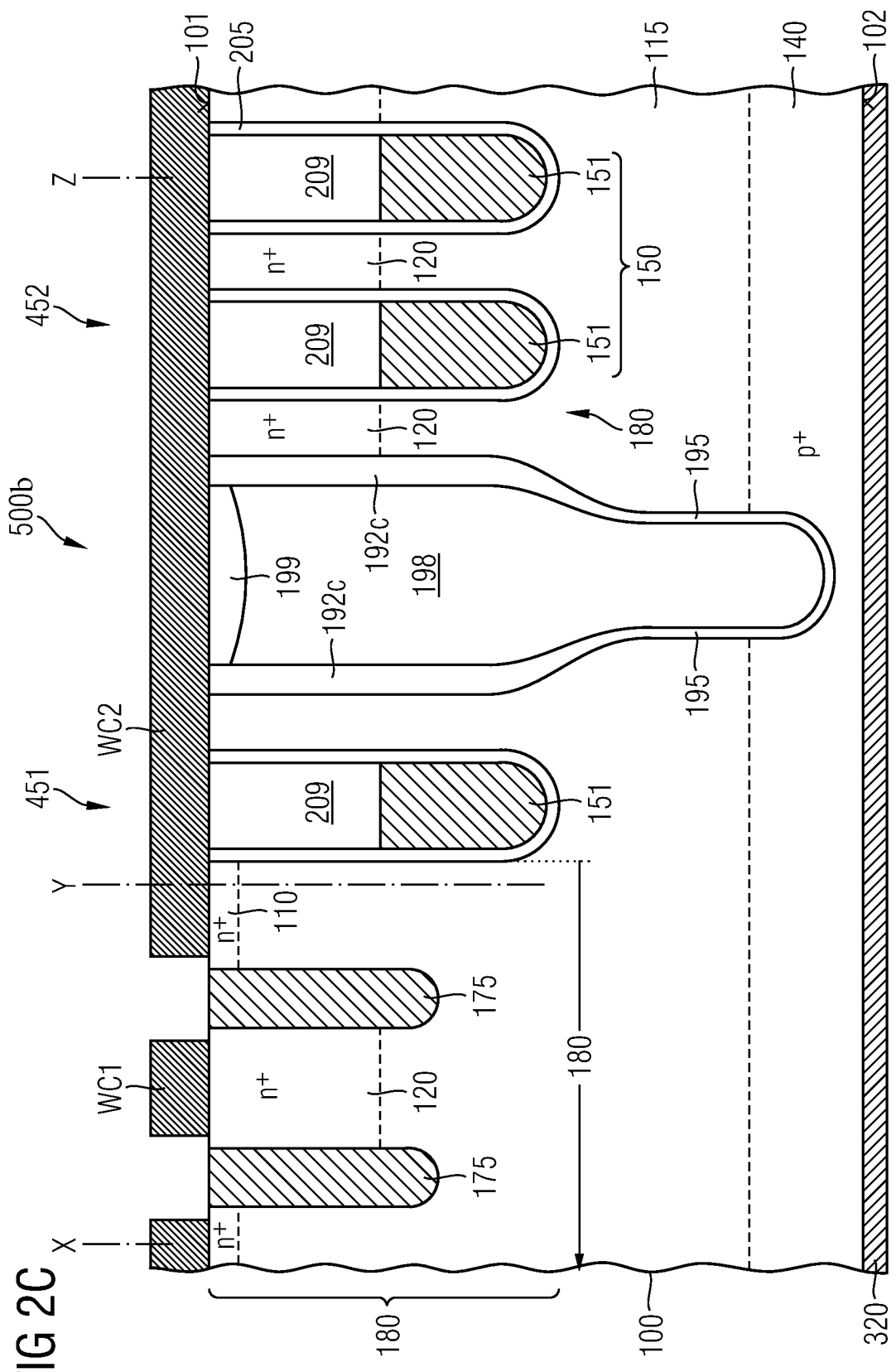
FIG. 2C is a schematic cross-sectional view of the semiconductor device portion of FIG. 2B along line X-Y-Z in accordance with an embodiment including a deep device separation structure.

FIGS. 2B and 2C show a semiconductor device 500b with a semiconductor portion 100 based on a single crystalline semiconductor material. The semiconductor portion 100 has a first surface 101 and a second surface 102 parallel to the first surface. In the semiconductor portion 100, a first cell array 451 includes transistor cells TC assigned to a first switching device, which may be, by way of example, the enhancement type IGFET TB of FIG. 2A, and a second cell array 452 includes transistor cells TC assigned to a second switching device, which may be, by way of example, the depletion type IGFET TA of FIG. 2A.

The cell arrays 451, 452 include notched semiconductor fins 180 with source regions s1, s2 and drain regions d1, d2 of the transistor cells TC oriented to the first surface 101.

The first and second cell arrays 451, 452 may be arranged along a first lateral axis. Within each cell array 451, 452 the transistor cells TC are arranged in a matrix, wherein source regions s1, s2 of a subset of adjacent transistor cells TC are arranged along the first lateral direction and the drain regions d1, d2 are arranged along a second lateral direction orthogonal to the first lateral direction with respect to the source region s1, s2 of the respective transistor cell TC. The source regions s1 of the first cell array 451 may be in the projection of the drain regions d2 of the second cell array 452 along the first lateral direction and the source region s2 of the second cell array 452 may be in the projection of the drain regions d1 of the first cell array 451 along the first lateral direction.

In each cell array 451, 452, array stripes 151 of a respective gate electrode structure 150 form active gate electrodes. The array stripes 151 run along the second lateral direction between neighboring notched semiconductor fines 180 that include the active transistor areas of the transistor cells TC. A gate dielectric layer 205 dielectrically insulates the gate electrode structures 150 from the surrounding semiconductor material of the semiconductor portion 100.

Separation structures 175 notching the semiconductor fins 180 separate source and drain regions s1, d1 or s2, d2 assigned to the same semiconductor fin 180 between the same pair of array stripes 151.

First wiring connections WC1 extend along the first lateral direction and may electrically connect the first source regions s1 arranged along the first lateral direction in the first cell array 451 with each other and with a source connector. Second wiring connections WC2 may electrically connect the first drain regions d1 in the first cell array 451 arranged along the first lateral direction with each other and with second source regions s2 in the second cell array 452. Third wiring connections WC3 electrically connect second drain regions d2 arranged along the first lateral direction in the second cell array 452 with each other and, e.g., with a drain connector or source regions of a further cell array assigned to a further switching device integrated in the same semiconductor die. The source connector SC may be connected to a source terminal S of the semiconductor device 500 and the drain connector may be connected to a drain terminal D of the semiconductor device 500.

Outside the cell arrays 451, 452, the gate electrode structures 150 may include contact stripes structurally connected with the array stripes 151, wherein one, two or more spacer stripes may structurally connect the array stripes with the contact stripe 153.

Fill structures 209 spatially separate the gate electrode structures 150 from the first surface 101. The drain regions d1, d2 are heavily doped drain zones 120 directly adjoining the first surface 101 in first sections of the notched semiconductor fins 180. The source regions s1, s2 are heavily doped source zones 110 in second sections of the notched semiconductor fins 180, and extend from the first surface 101 up to a distance to the first surface 101 that approximately corresponds to the distance between the gate electrode structures 150 and the first surface 101. Each source zone 110 may be an impurity zone or may include a heavily doped polycrystalline first section directly adjoining the first surface 101 and a single crystalline second section directly adjoining the first section.

The semiconductor portion 100 may further include a substrate layer 140 along the second surface 102. A substrate metallization 320 may or may not directly adjoin the second surface 102. The substrate layer 140 may have an impurity type opposite to the impurity type of the source and drain zones 110, 120. Between the source and drain zones 110, 120 on the one side and the substrate layer 140 on the other side, the semiconductor portion 100 may include a channel/body layer 115 directly adjoining the source and drain zones 110, 120. For transistors of the enhancement type, the channel/body layer 115 includes body portions of the opposite conductivity type of the source and drain zones 110, 120, wherein the body portions connect the source and drain zones 110, 120 of the respective transistor cells TC. For depletion type transistors, the channel/body layer 115 includes channel portions having the same conductivity type as the source and drain zones 110, 120. The channel/body layer 115 may include further impurity zones and layers, for example forming pn junctions for device separation.

For depletion type transistors, a suitable voltage applied at the gate electrode structure 150 fully depletes the channel portion between the source and drain zones 110, 120 such that the transistor cells TC are in an off-state. Otherwise a current flows between the source and drain zones 110, 120 of each transistor cell TC. For enhancement type transistors, a conductive channel of minority charge carriers may be formed in the body portions if a potential applied at the gate electrode structure 150 is sufficiently high.

The first, second and third wiring connections WC1, WC2, WC3 may directly adjoin the first surface 101 or a plane spanned by the first surface 101. Other embodiments may provide a dielectric layer 220 between the wiring connections WC1, WC2, WC3 and the first surface, wherein contact structures extending through openings in the dielectric layer 220 electrically connect the first, second and third wiring connections WC1, WC2, WC3 with the source and drain zones 110, 120.

Between the first and second cell arrays 451, 452 and further cell arrays, device separation structures 190 or portions of device separation structures 190 extend along the second lateral direction. According to an embodiment, at least one device separation structure 190 completely surrounds one of the cell arrays 451, 452 in the lateral directions. For example, each cell array 451, 452 is completely surrounded by another device separation structure 190, wherein device separation structures 190 of neighboring cell arrays may share common portions. According to an embodiment, the device separation structures 190 of a plurality of cell arrays form a ladder-like structure with the cell arrays formed between the rungs.

A patterned insulator layer 192*c* may line a first section of the device separation structure 190 oriented to the first surface 101. A passivation layer 195 may line an extension portion 191*z* oriented to the second surface 102. The extension portion 191*z* may or may not reach the substrate layer 140. A distance between the first surface 101 and a buried edge of the device separation structure may be at least 3 μm, for example 10 μm or more. The device separation structure 190 may contain a device separation void 198 closed by a dielectric plug 199 along the first surface 101. According to other embodiments, the device separation structure 190 may include a fill portion of a dielectric material and/or an intrinsic semiconductor material. The fill portion may partially or completely fill the space enclosed by the patterned insulator layer 192*c* and the passivation layer 195.

The device separation structure 190 sustains a potential difference between structures of neighboring cell arrays 451, 452, as well as between the structures of the cell arrays 451, 452 and further structures in the semiconductor device 500, wherein providing the device separation structures 190 gets by without additional lithography mask.

FIG. 3 shows a semiconductor device 500*c* with a bottle-shaped device separation structure 190, wherein the extension portion 191*z* has a wider lateral cross-sectional area than the opening of the patterned insulator layer 192*c*. A dielectric layer 220 may be provided between the first surface 101 and the wiring connections WC, wherein contact structures 305 extending through openings in the dielectric layer 220 electrically connect the wiring connections WC with the source and drain zones 110, 120.

Figure 4A:
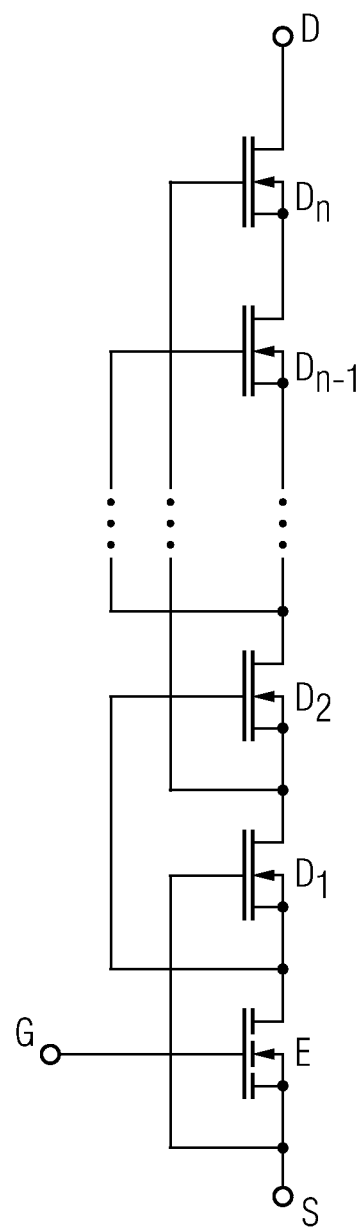
FIG. 4A is a circuit diagram of an ADZFET (active drift zone field effect transistor).

FIG. 4A shows a semiconductor device 500*d* including an ADZFET based on a plurality of switching devices electrically arranged in a cascode configuration. According to the illustrated embodiment, the semiconductor device 500*d* includes an enhancement type IGFET E and a plurality of depletion type IGFETs D1, D2, Dn.

Figure 4B:
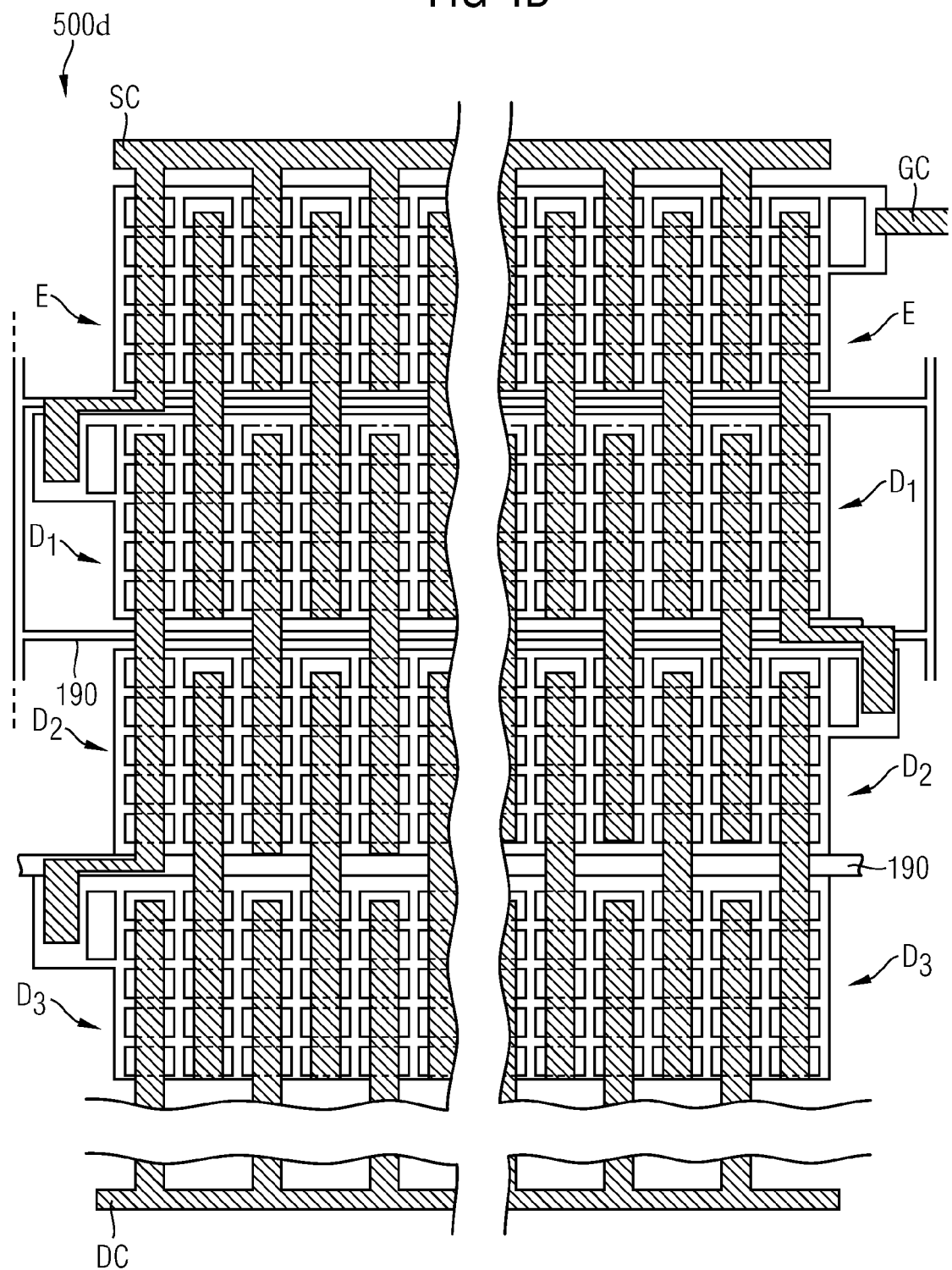
FIG. 4B is a schematic plan view of a wiring plane of the ADZFET of FIG. 4A, in accordance with a further embodiment of the invention.

FIG. 4B shows a planar view of the wiring connections of the semiconductor device 500*d* of FIG. 4A following the pattern described above. Each of the IGFETs E, D1, D2, Dn may be completely surrounded by a device separation structure 190 in the lateral directions. A gate connection GC may electrically connect or may be part of an electric coupling of the gate electrode structure 150 of the enhancement type IGFET with an output terminal of an internal gate driver circuit or a gate terminal. The device separation structures 190 as described above sustain a respective voltage difference between structures in neighboring switching devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a first gate electrode structure buried in a semiconductor portion in a first cell array at a distance to a first surface of the semiconductor portion, the first gate electrode structure including parallel array stripes;
    a second gate electrode structure buried in the semiconductor portion in a second cell array adjacent to the first cell array, the second gate electrode structure including parallel array stripes;
    a device separation structure between the first and second cell arrays, the device separation structure having a first width; and
    cell separation structures having at most a second width smaller than the first width and notching, at the first surface, semiconductor fins formed from sections of the semiconductor portion between the array trenches.

2. The semiconductor device according to claim 1, wherein the device separation structure includes a first section oriented to the first surface and an extension section oriented to a second surface of the semiconductor portion parallel to the first surface, the extension section having a smaller lateral cross-sectional area parallel to the first surface than the extension section.

3. The semiconductor device according to claim 1, wherein the device separation structure includes a first section oriented to the first surface and an extension section oriented to a second surface of the semiconductor portion parallel to the first surface, the extension section having a greater lateral cross-sectional area parallel to the first surface than the extension section.

4. The semiconductor device according to claim 1,
wherein the device separation structure includes an insulator layer in a first section oriented to the first surface, the insulator layer extending parallel to a vertical interface with a semiconductor material of the semiconductor portion, and
wherein the insulator layer and the cell separation structures are made of a same material.

5. The semiconductor device according to claim 1, wherein the device separation structure includes a void.

6. The semiconductor device according to claim 1, wherein a buried edge of the device separation structure has a greater distance to the first surface than a buried edge of the gate electrode structures.

7. The semiconductor device according to claim 1, wherein ridges formed from portions of the semiconductor portion separate the device separation structure from the first and second cell arrays.

8. The semiconductor device according to claim 1, wherein the device separation structure completely surrounds the first cell array in lateral directions parallel to the first surface.

9. An active drift zone field effect transistor (ADZFET), comprising:
- a first gate electrode structure buried in a semiconductor portion in a first cell array at a distance to a first surface of the semiconductor portion, the first gate electrode structure including parallel array stripes;
- a second gate electrode structure buried in the semiconductor portion in a second cell array adjacent to the first cell array, the second gate electrode structure including parallel array stripes;
- a device separation structure between the first and second cell arrays, the device separation structure having a first width; and
- cell separation structures having at most a second width smaller than the first width and notching, at the first surface, semiconductor fins formed from sections of the semiconductor portion between the array trenches.

* * * * *